United States Patent
Yoshimoto et al.

(10) Patent No.: US 7,479,627 B2
(45) Date of Patent: Jan. 20, 2009

(54) SEMICONDUCTOR DEVICE HAVING TRANSPARENT MEMBER AND MANUFACTURING METHOD OF THE SAME

(75) Inventors: Kazuhiro Yoshimoto, Kawasaki (JP);
Yuzo Shimobeppu, Kawasaki (JP);
Kazuo Teshirogi, Kawasaki (JP);
Yoshiaki Shinjo, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 79 days.

(21) Appl. No.: 11/408,970

(22) Filed: Apr. 24, 2006

(65) Prior Publication Data

US 2007/0181792 A1   Aug. 9, 2007

(30) Foreign Application Priority Data

Feb. 9, 2006  (JP) .............................. 2006-032664

(51) Int. Cl.
*H04N 5/225* (2006.01)
(52) U.S. Cl. ................ 250/239; 257/433; 257/434; 438/64
(58) Field of Classification Search ............... 250/239; 257/433, 434; 438/64, 65
See application file for complete search history.

(56) References Cited

U.S. PATENT DOCUMENTS

| | | | | |
|---|---|---|---|---|
| 6,825,458 | B1 * | 11/2004 | Moess et al. | 250/239 |
| 6,930,327 | B2 | 8/2005 | Maeda et al. | |
| 7,262,475 | B2 * | 8/2007 | Kwon et al. | 257/433 |
| 2003/0155639 | A1 * | 8/2003 | Nakamura et al. | 257/680 |
| 2004/0075761 | A1 * | 4/2004 | Maeda et al. | 348/340 |
| 2004/0159920 | A1 * | 8/2004 | Omori | 257/676 |
| 2006/0051887 | A1 * | 3/2006 | Yamamoto et al. | 438/64 |

FOREIGN PATENT DOCUMENTS

| | | |
|---|---|---|
| JP | 5-13738 | 1/1993 |
| JP | 5-41506 | 2/1993 |
| JP | 2002-231919 A | 8/2002 |
| JP | 2003-092394 A | 3/2003 |
| JP | 2004-363380 | 12/2004 |
| JP | 2005-286028 A | 10/2005 |
| JP | 2005-322851 A | 11/2005 |

OTHER PUBLICATIONS

Korean Office Action dated May 31, 2007, issued in corresponding Korean Application No. 10-2006-0043796.
Office Action, Chinese Patent Application No. 200610079895.8 dated Aug. 15, 2008 with English Translation.

* cited by examiner

*Primary Examiner*—Georgia Y Epps
*Assistant Examiner*—Tony Ko
(74) *Attorney, Agent, or Firm*—Westerman, Hattori, Daniels & Adrian, LLP.

(57) ABSTRACT

A semiconductor device, includes a semiconductor substrate having a main surface where a light receiving element area is formed; a projection part provided in the periphery of the light receiving element area on the main surface of the semiconductor substrate; an adhesive material layer provided in the external periphery of the projection part on the main surface of the semiconductor substrate; and a transparent plate supported by the projection part and fixed above the light receiving element area by the adhesive material layer.

11 Claims, 17 Drawing Sheets

SEMICONDUCTOR DEVICE HAVING TRANSPARENT MEMBER AND MANUFACTURING METHOD OF THE SAME

BACKGROUND OF THE INVENTION

1. Field of the Invention

The present invention generally relates to semiconductor devices and manufacturing methods of the same, and more specifically, to a semiconductor device wherein a transparent member is provided above a light receiving part which light receiving part is provided on a main surface of a semiconductor element and a manufacturing method of the semiconductor device.

2. Description of the Related Art

A solid-state image sensing device formed by packaging and modularizing a solid-state image sensor with a transparent member such as glass, a wiring board, wiring connecting the solid-state image sensor and the wiring board, sealing resin, and others, is well-known. Here, the solid-state image sensing device is, for example, an image sensor such as a Charge Couple Device (CCD) or Complementary Metal Oxide Semiconductor (CMOS).

In such a solid-state image sensing device, a transparent member is provided above the solid-state image sensor so that light is incident outside onto a light receiving surface of the solid-state image sensor via the transparent member.

For example, Japanese Laid-Open Patent Application Publication No. 5-13738 discloses a structure shown in FIG. 1 of a solid-state image sensing device 1 where a solid-state image sensor 3 is mounted on a lead frame 2 and connected to an outside connection lead with a bonding wire 4; an on-chip lens 5 is provided on an upper surface of the solid-state image sensor 3; a transparent glass plate 7 is provided via a space 9; and the solid-state image sensor 3 and the transparent glass plate 7 are integrally sealed by transparent resin 8.

Japanese Laid-Open Patent Application Publication No. 5-41506 discloses a structure shown in FIG. 2 of a solid-state image sensing device 10 where a solid-state image sensor 11 is mounted on a lead frame 12; a glass plate 17 is provided on an upper surface of the solid-state image sensor 11 via a micro-lens 14 and a resin layer 15 whose refractive index is low; and the glass plate 17, the solid-state image sensor 11, the micro-lens 14, and the resin layer 15 are integrally sealed by transparent resin 16.

Japanese Laid-Open Patent Application Publication No. 2004-363380 discloses an optical semiconductor device 20, as shown in FIG. 3, having an optical semiconductor element 22 having a circuit part 21 including a light receiving element formed on the surface thereof; a terminal part 27 provided on a rear surface of the optical semiconductor element 11 and electrically connected to the circuit part 21 via rewiring 25; a coating layer 28 made of a transparent material such as a glass plate covering the surface of the optical semiconductor element 22 via transparent adhesive resin 23; and sealing resin 26 covering a side surface of the coating layer 28 and the optical semiconductor element 22.

However, in the structure shown in FIG. 1, the transparent resin 8 is provided above the transparent glass plate 7. Hence, while the outside light may not be absorbed by the transparent resin 8, incident light may be scattered or reflected due to minute concave and convex area provided on the surface of the transparent resin 8.

In order to improve flatness of the surface of the molded transparent resin 8, it is necessary to improve smoothness of a mold, namely make the surface roughness of the mold small, or grind the surface of the transparent resin 8 after the molding process. Such a process causes increase of the manufacturing cost.

In addition, in the structure shown in FIG. 2, since the resin 16 is transparent, even if the transparent resin 16 extends on the light receiving surface of the glass plate 17, reduction of the amount of the light incident on the glass plate 17 may not be caused.

However, in order for the transparent resin 16 to continue having the light transmission characteristic, filler such as glass fiber or carbon particles is not added to the transparent resin 16.

Therefore, the transparent resin 16 has a large coefficient of thermal expansion and therefore may be deformed in a sealing process or a heating process when mounted on the electronic apparatus. A deformation such as a curve may be generated in the solid-state image sensing apparatus 10 by deformation of the transparent resin 16 so that a large force may be applied to the glass plate 17, the micro-lens 14 and the solid-state image sensor 11. This may cause decrease in the ability of the solid-state image sensing apparatus 10.

On the other hand, in the structure shown in FIG. 3, side surfaces of the coating layer 28 and the optical semiconductor element 22 coated by the sealing resin 26 are tilted surfaces. Therefore, the necessary width of the semiconductor element 22 is large so that the number of semiconductor elements (chips) in a single semiconductor substrate may be small. Furthermore, a special design is required whereby a chip gap in the semiconductor substrate is spread so that manufacturing cost is increased. In addition, a technique of, for example, photolithography is necessary for forming the rewiring 25 so that large-scale equipment is required.

Furthermore, even if a bad chip is included with the good chips, the coating layer 28 and the rewiring 25 are provided and resin sealing is implemented in a lump. Hence, the yield is lowered so that it may be difficult to manufacture the optical semiconductor device 20 at low cost.

Meanwhile, Japanese Laid-Open Patent Application Publication No. 2004-363380 also discloses a structure where the circuit element 21 and the terminal part 27 are electrically connected by a piercing electrode and the side surface parts of the coating layer 28 and the optical semiconductor device 22 are covered with the sealing resin 26.

However, in this structure, it is necessary to make the chip gap in the semiconductor substrate spread for sealing the side surfaces with the resin. In addition, a process from forming the rewiring to the resin sealing is made by the lump process and therefore the above-mentioned problem cannot be solved.

SUMMARY OF THE INVENTION

Accordingly, the present invention may provide a novel and useful semiconductor device and manufacturing method of the same solving one or more of the problems discussed above.

Another and more specific object of the present invention may be to provide a semiconductor device with a simple structure whereby the amount of light incident on a light receiving surface of a semiconductor element is increased.

It is also an object of the present invention to provide a manufacturing method of a semiconductor device whereby a small-sized semiconductor device having good light transmission capability can be stably manufactured at high productivity.

The above object of the present invention is achieved by a semiconductor device, including: a semiconductor substrate having a main surface where a light receiving element area is formed; a projection part provided in the periphery of the light receiving element area on the main surface of the semiconductor substrate; an adhesive material layer provided in the external periphery of the projection part on the main surface of the semiconductor substrate; and a transparent plate supported by the projection part and fixed above the light receiving element area by the adhesive material layer.

The above object of the present invention is also achieved by a manufacturing method of a semiconductor device, including the steps of forming a light receiving element area on a main surface of a semiconductor substrate; providing a projection part and an adhesive material layer in the periphery of the light receiving element area on the main surface of the semiconductor substrate; and supporting a transparent plate above the light receiving element area by the projection part and fixing the transparent plate by the adhesive layer.

The above object of the present invention is also achieved by a manufacturing method of a semiconductor device, including the steps of: forming a plurality of light receiving element areas on a main surface of a semiconductor substrate; providing a plurality of projection parts and a plurality of adhesive material layers in the periphery of the light receiving element areas on the main surface of the semiconductor substrate; supporting a transparent plate above the light receiving element areas by the projection parts and fixing the transparent plate by the adhesive layers; and cutting the semiconductor substrate and the transparent plate so as to make pieces of the semiconductor substrate and the transparent plate.

According to the present invention, it is possible to provide the semiconductor device with a simple structure whereby the amount of light incident on the light receiving surface of the semiconductor element is increased. In addition, it is also possible to provide the manufacturing method of the semiconductor device whereby a small-sized semiconductor device having good light transmission can be stably manufactured at high productivity.

Other objects, features, and advantages of the present invention will be come more apparent from the following detailed description when read in conjunction with the accompanying drawings.

DETAILED DESCRIPTION OF THE PREFERED EMBODIMENTS

A description is given below, with reference to the FIG. 4 through FIG. 24 of embodiments of the present invention.

For the convenience of explanation, first, an embodiment of a semiconductor device of the present invention is discussed and then an embodiment of a manufacturing method of the semiconductor device of the present invention is discussed. In the following explanations, a solid-state image sensing device is discussed as an example of the semiconductor device of the present invention.

[Semiconductor device]

Figure 1:
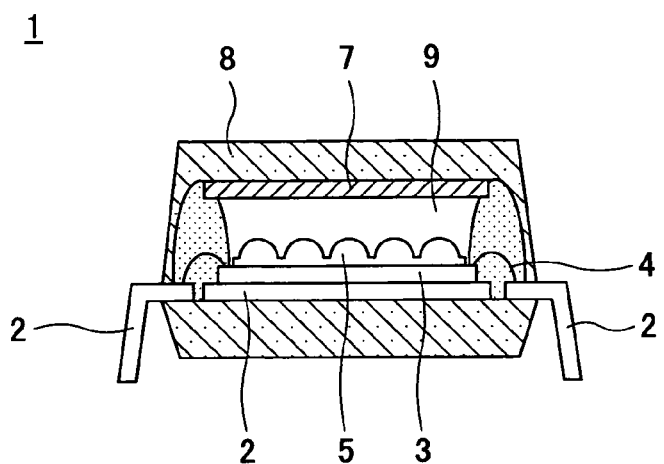
FIG. 1 is a first cross-sectional view of a related art solid-state image sensing apparatus.
Figure 2:
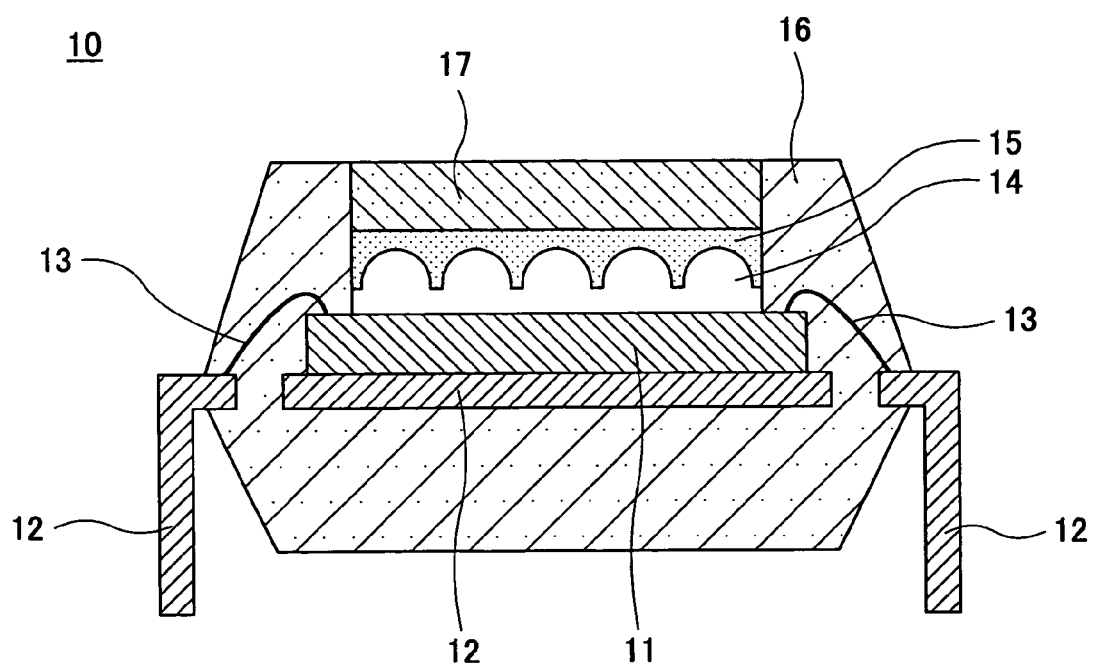
FIG. 2 is a second cross-sectional view of the related art solid-state image sensing apparatus.
Figure 3:
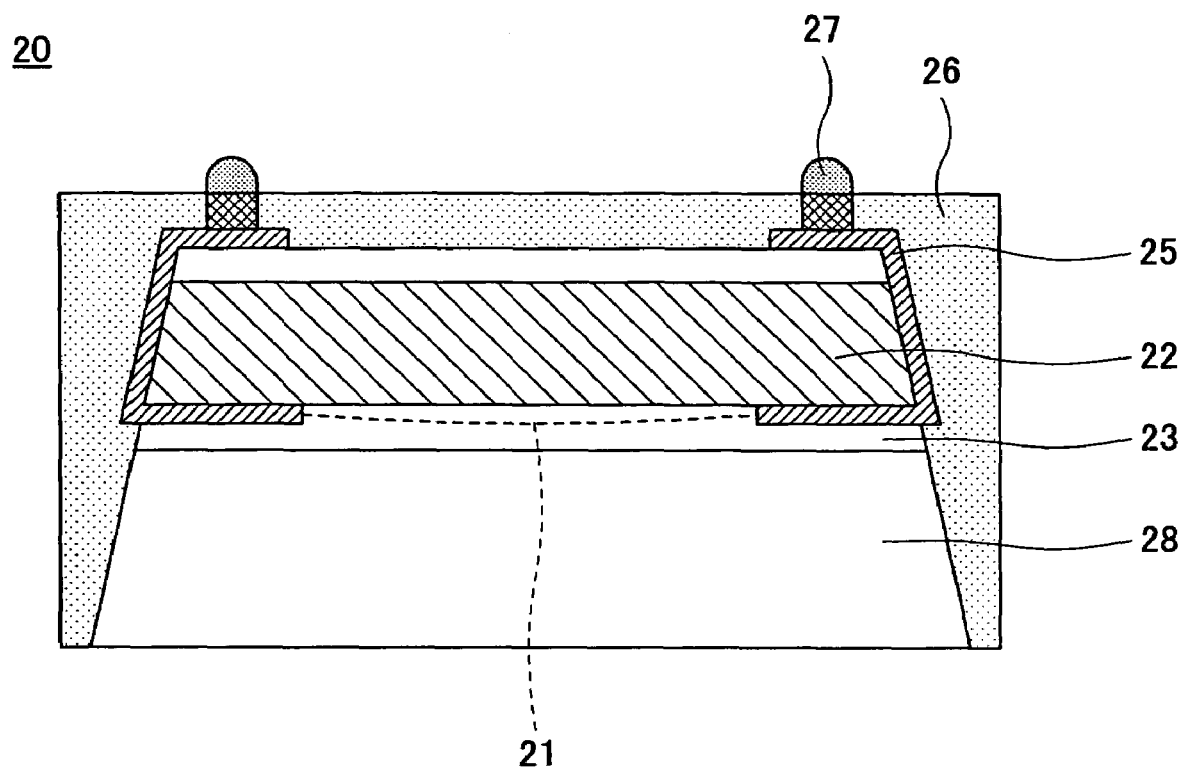
FIG. 3 is a third cross-sectional view of the related art solid-state image sensing apparatus.
Figure 4:
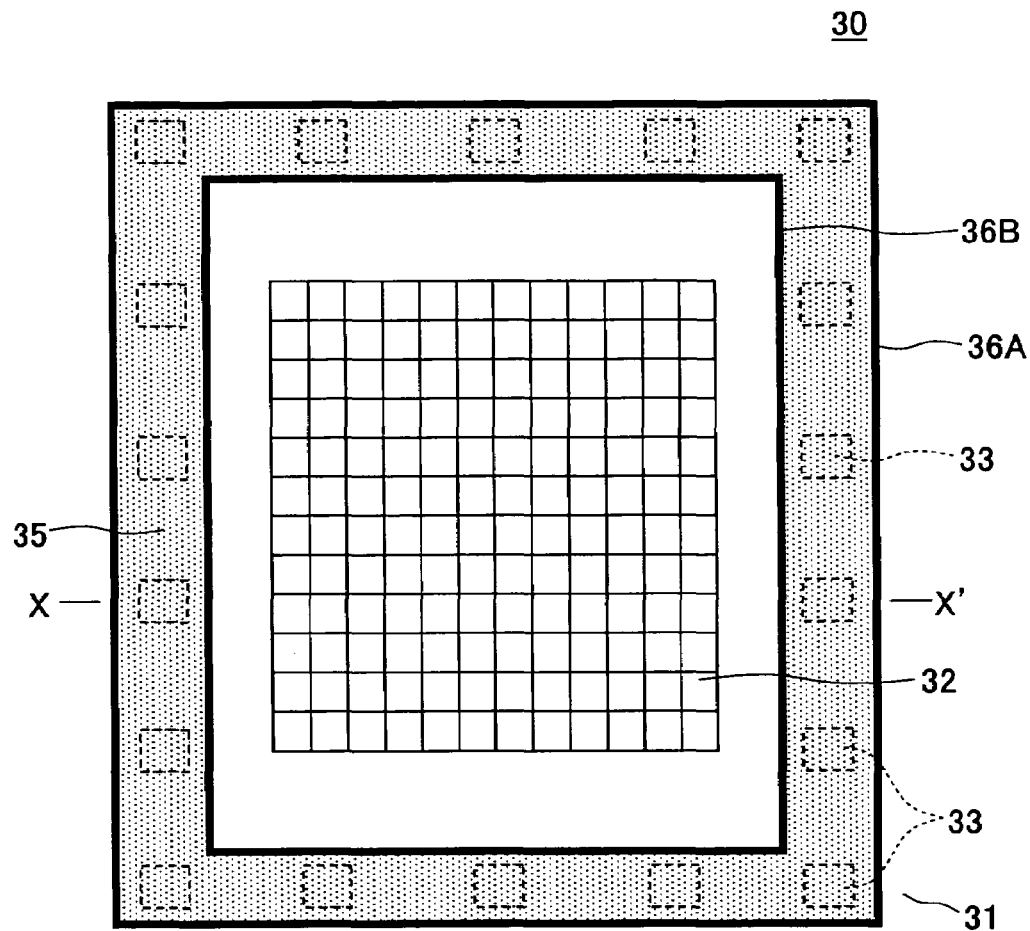
FIG. 4 is a plan view of a solid-state image sensing device of a first embodiment of the present invention.
Figure 5:
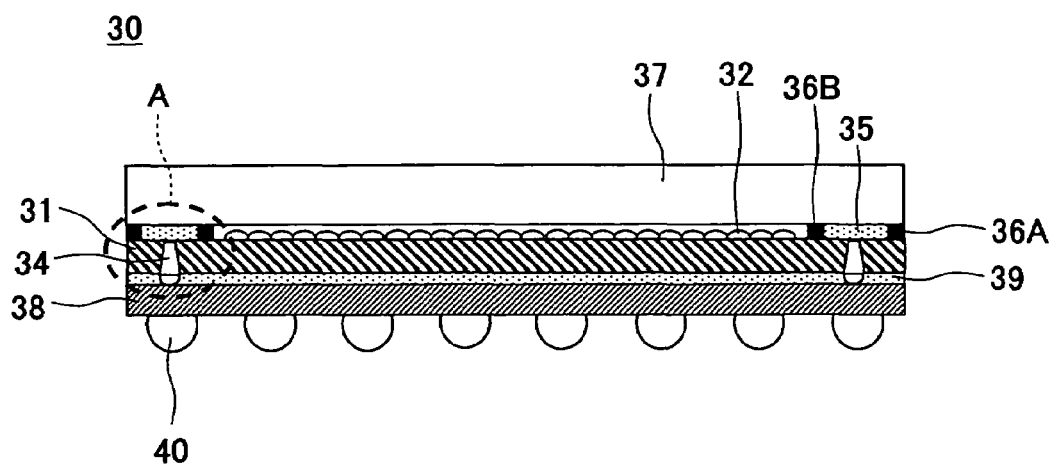
FIG. 5 is a cross-sectional view of a solid-state image sensing device having the solid image sensor shown in FIG. 4.

FIG. 4 is a plan view of a solid-state image sensing device 30 of a first embodiment of the present invention. FIG. 5 is a cross-sectional view taken along line X-X' of the solid-state image sensing device 30 having the solid image sensor. In FIG. 4, illustration of a transparent plate provided above the semiconductor substrate is omitted.

Referring to FIG. 4 and FIG. 5, in the solid-state image sensing apparatus 30 of a first embodiment of the present invention, a light receiving element area is formed substantially in the center of a main surface (upper surface) of a semiconductor substrate 31 made of silicon. The light receiving element area includes plural CCD type or MOS type light receiving elements. A micro-lens 32 covers the light receiving element area.

On the other hand, in the other main surface of the semiconductor substrate 31, plural outside connection terminals are provided in the vicinity of edge parts so as to surround the light receiving element area. The outside connection terminals 33 are led to the other main surface (rear surface) of the semiconductor substrate 31 by piercing electrodes 34 piercing the semiconductor substrate 31.

In addition, in this embodiment, an adhesive material layer 35 is provided in a continuous belt shape so as to cover an arrangement line of the outside connection terminals 33. Continuous projection parts 36A and 36B made of insulation material and having the same height as that of the adhesive material layer 35 are provided at side surfaces of the adhesive material layer 35. A transparent plate 37 made of glass is fixed on the semiconductor element 31 via the adhesive material layer 35.

Under this structure, height (thickness) of the continuous projection parts 36A and 36B made of the insulation material and the adhesive material layer 35 is selected so as to provide a space where air can exist between the micro-lens 32 and the transparent plate 37.

The piercing electrode 34 made of glass ceramic is connected to an electrode terminal formed on a main surface of a supporting substrate 38. The supporting substrate 38 has a single layer or plural layers of wiring so that the semiconductor substrate 31 can be electrically and mechanically connected to the supporting substrate 38. The supporting substrate 38 may be called a wiring board, a circuit substrate, or an interposer.

An underfill 39 made of resin is applied between the semiconductor element 31 and the supporting substrate 38 so that the unification of the semiconductor substrate 31 and the supporting substrate 38 is made strong. Outside connection terminals 40 made of solder balls are provided on the other main surface, namely a lower surface of the supporting substrate 38.

Figure 6:
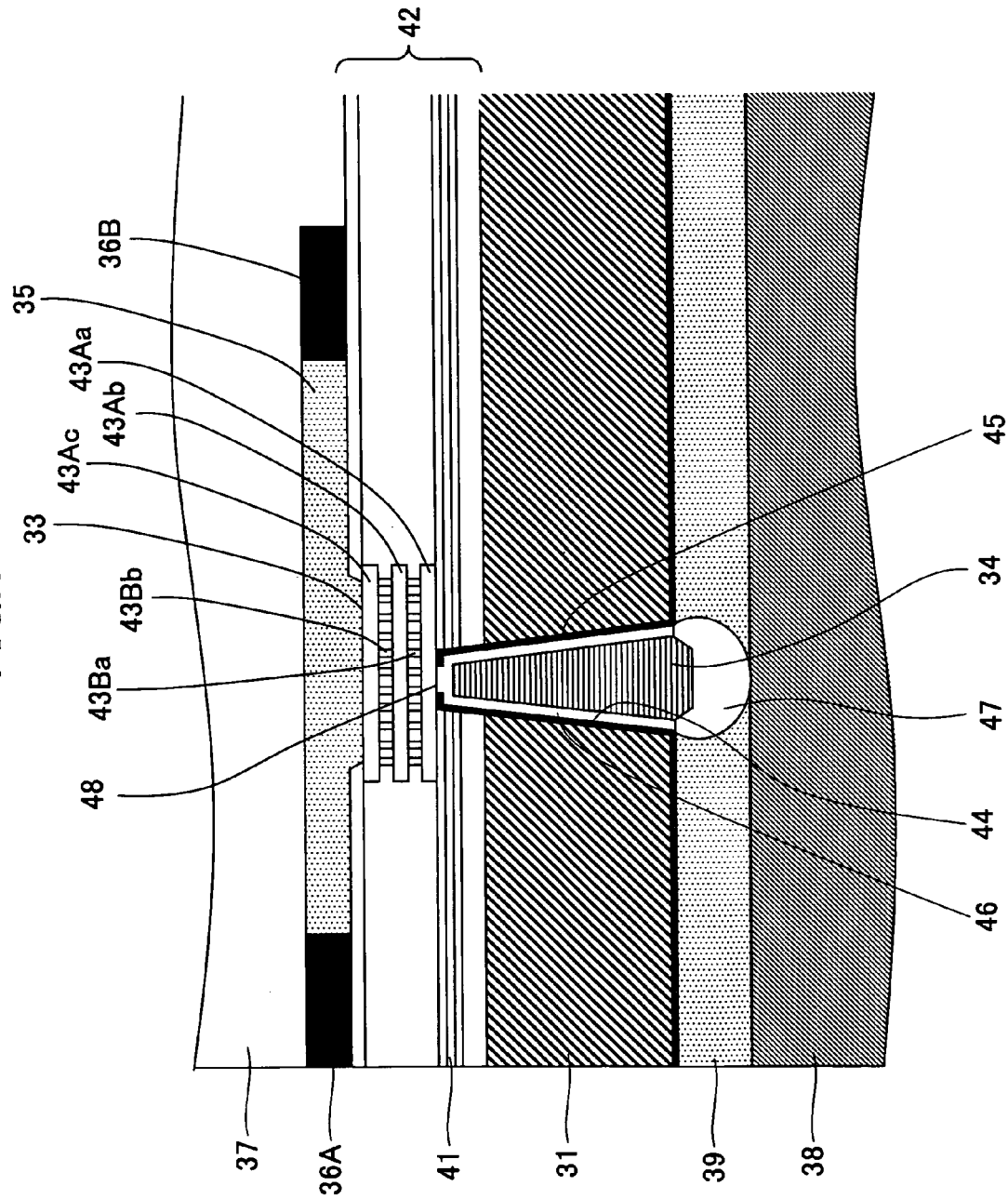
FIG. 6 is an expanded view of a part surrounded by a dotted line A in FIG. 5.

Next, a structure of the piercing electrode 34 is discussed with reference to FIG. 6. FIG. 6 is an expanded view of a part surrounded by a dotted line A in FIG. 5. Referring to FIG. 6, an electronic circuit part (not shown in FIG. 6) is formed on the upper surface of the semiconductor substrate 31. A back grinding process is applied to the semiconductor substrate 31 by a well-known method so that the thickness of the semiconductor substrate 31 is 25 µm through 100 µm. A wiring layer 41 led from the electronic circuit part extends in an insulation layer 42 so as to be connected to an outside connection terminal 33.

The outside connection terminal 33 is formed by, for example, three aluminum (Al) layers 43Aa, 43Ab, and 43Ac and tungsten (W) plugs 43Ba and 43Bb provided between the aluminum layers 43A. If necessary, a plating layer formed by gold (Au) upper most layer/nickel (Ni)/copper (Cu)/titanium (Ti) base layer may be provided on a surface of the uppermost aluminum layer 43Ac. The upper surface of the outside connection terminal 33 is flat.

A piercing hole 44 is formed in the semiconductor substrate 31 below the outside connection terminal 33. While the diameter at a lower surface side of the semiconductor substrate 31 of the piercing hole 44 is large, the diameter at an upper surface side of the semiconductor substrate 31, namely a side of the outside connection terminal 33, of the piercing hole 44 is small. That is, the piercing hole 44 has a taper (cone) shaped-configuration.

The piercing electrode 34 is provided in the piercing hole 44 via an insulation layer 45 and a seed metal layer 46. The insulation layer 45 is formed so as to cover the internal circumferential surface of the piercing hole 44. The insulation layer 45 is made of silicon dioxide ($SiO_2$) and has a film thickness of approximately 1 µm. Alternatively, the insulation layer 45 may be a silicon nitride ($Si_3N_4$) layer.

One end of the piercing electrode 34 is electrically connected to the outside connection terminal 33. The other end of the piercing electrode 34 projects from the lower surface of the semiconductor substrate 31 extending 5 through 15 µm. A plating layer 47 may be formed on the surface of the projection part of the piercing electrode 34. The plating layer 47 is made of a nickel (Ni) base layer and a gold (Au) surface layer. The thickness of the nickel (Ni) layer may be approximately 2 µm. The thickness of the gold (Au) layer may be approximately 0.5 µm.

Under this structure, the piercing electrode 34 and the outside connection terminal 33 are electrically connected to each other via wiring layer 41 formed in the insulation layer 42. Thus, the outside connection terminal 33 provided at the upper surface side of the semiconductor substrate 31 is electrically led to the lower surface (rear surface) of the semiconductor substrate 31 via the piercing electrode 34.

On the other hand, a dam structure, formed by the adhesive material layer 35 provided on the arrangement of the outside connection terminals 33 and the continuous projection parts 36A and 36B provided at both sides of the adhesive material layer 35 and made of first and second insulation layers, is provided at an upper surface side of the semiconductor substrate 31. The projection parts 36A and 36B have heights of approximately 5 µm through 20 µm. However, the present invention is not limited to this height. By this height, it is possible to easily apply the adhesive and form the dam structure whereby unnecessary flow of the adhesive is prevented.

The continuous projection parts 36A and 36B made of insulation material are formed by selectively removing the insulation material adhered on the upper surface side of the semiconductor substrate 31 such as silicon nitride, polyimide, a dry film, a resist material, or the like with a so-called photo process. Furthermore, the adhesive is applied between the projection parts 36A and 36B so that the adhesive layer 35 is formed. Thermosetting epoxy resin, ultraviolet curing resin, or both the thermosetting epoxy resin and the ultraviolet curing resin can be used as the adhesive forming the adhesive layer 35 as following a property of the solid-state image sensing apparatus 30.

An adhesive having a viscosity of approximately 10 through 50 Pa·s or an adhesive having a low viscosity of 1 Pa·s whereby voids may not be generated can be used as the adhesive in this embodiment. Even if the viscosity of the adhesive is lower, it is possible to prevent the adhesive force from being reduced due to unnecessary flow of the adhesive by the dam structure. In addition, an adhesive having a low coefficient of water absorption or curing shrinkage can be used.

In addition, the adhesive is used in an area other than an upper part of the micro-lens 32. Hence, it is not necessary to consider the light transmission capability of the adhesive. Therefore, it is possible to add filler such as glass fiber or carbon particles into the adhesive. Hence, in the sealing process or the heating process when the solid-state image sensing apparatus 30 is mounted on the electronic apparatus, it is possible to prevent deformation such as a curve in the solid-state image sensing apparatus 30 due to such an adhesive.

Because of such a dam structure, a space is formed between the transparent plate 37 and the micro-lens 32 without causing contact of the transparent plate 37 and the micro-lens 32, and the transparent plate 37 is provided and fixed above the semiconductor substrate 31.

In the examples shown in FIG. 4 through FIG. 6, the continuous projection parts 36A and 36B are formed on the upper surface of the semiconductor substrate 31 and the adhesive is applied between the continuous projection parts 36A and 36B, so that a dam structure is formed. The projection parts 36A and 36B made of insulation material are formed as corresponding to the area where the outside connection terminals 33 are formed.

However, the present invention is not limited to this. An area where the dam structure is formed can be optionally selected as long as the area is provided on the semiconductor substrate 31 and does not include the micro lens 32 and the light receiving element area.

For example, the dam structure may be as shown in FIG. 7 through FIG. 11. Here, FIG. 7 through FIG. 11 are plan views of a solid-state image sensor having first through fifth modified examples, respectively, of the dam structure.

Figure 7:
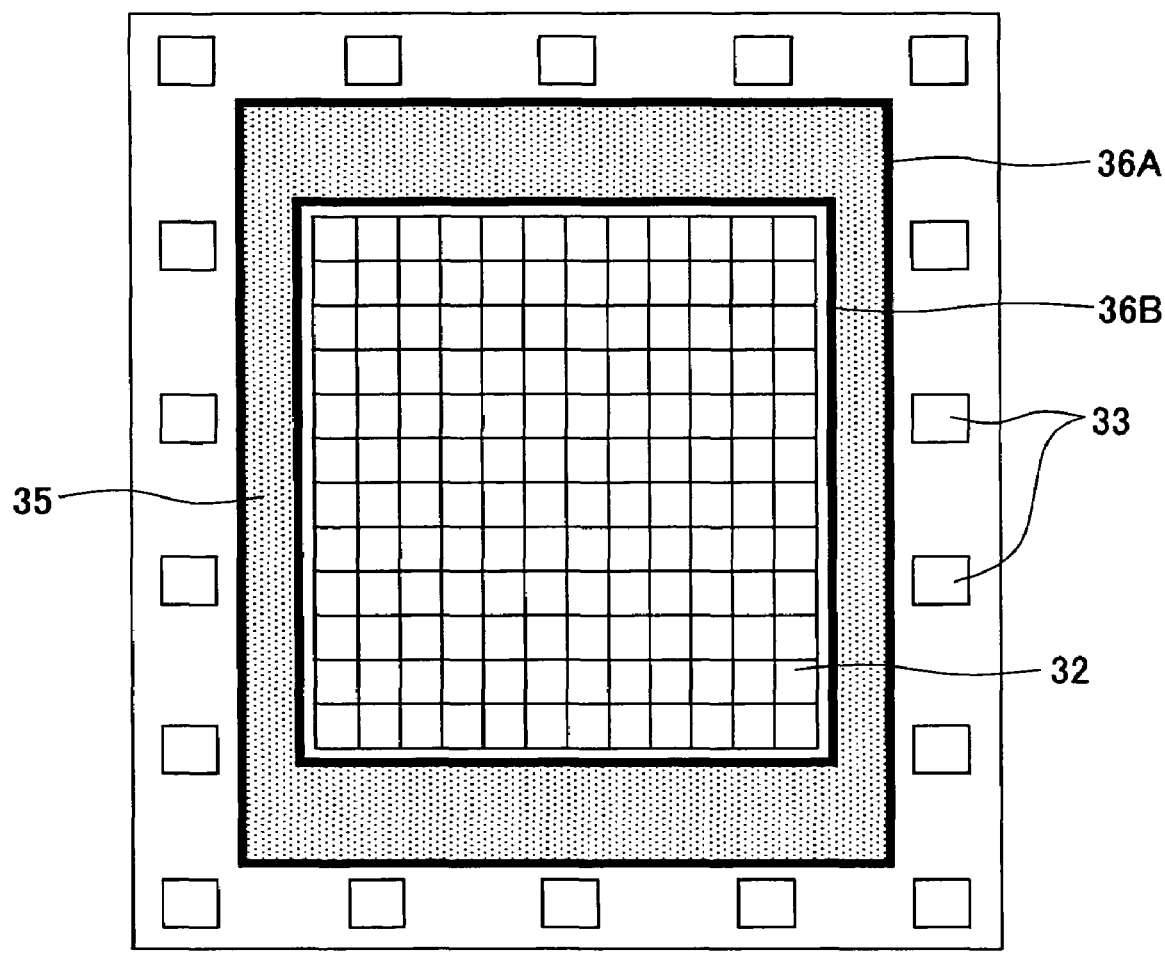
FIG. 7 is a plan view of a solid-state image sensor having a first modified example of a dam structure.

In a solid-state image sensor 55 shown in FIG. 7, the projection parts 36A and 36B are provided between the micro lens 32 and an area where the outside connection terminals 33 are located. The continuous projection parts 36A and 36B made of insulation material are provided in parallel with four corresponding sides of the solid-state image sensor 55. Under this structure, it is possible for the projection parts 36A and 36B to prevent unnecessary flow of the adhesive.

On the other hand, the projection parts 36A and 36B and the adhesive material layer 35 are not provided on the outside connection terminals 33. Hence, the outside connection terminals 33 can be used as wire bonding terminals or testing terminals.

Figure 8:
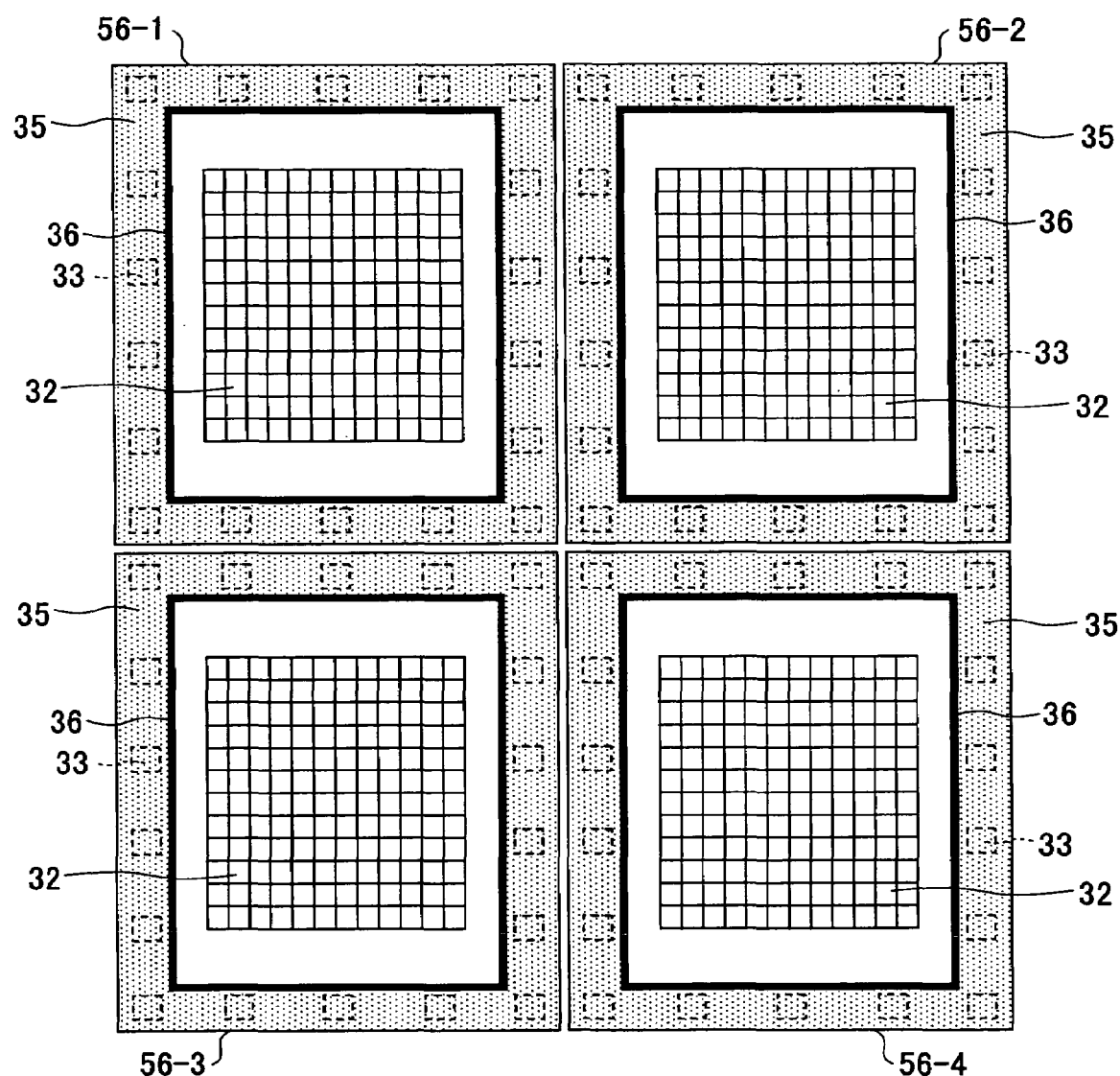
FIG. 8 is a plan view of a solid-state image sensor having a second modified example of a dam structure.

In four solid-state image sensors 56-1 through 56-4 shown in FIG. 8, the adhesive material layers 35 are provided along circumferential edge parts of the semiconductor substrates of the solid-state image sensors 56-1 through 56-4 and cover the outside connection terminals 33. The continuous projection parts 36 made of insulation material are provided between the adhesive material layers 35 and the micro lenses 32.

This structure is formed by the following process. That is, after the continuous projections 36 made of insulation material are provided in the periphery of the light receiving element areas of the solid-state image sensors where the solid-state image sensors are not cut and separated from the semiconductor substrate but are adjacent to each other, the adhesive material layers 35 are formed so as to cover the outside connection terminals 33 between neighboring solid-state image sensors and then the solid-state image sensors are separated.

According to this structure, unnecessary flow of the adhesive to the light receiving element area is prevented by the projection parts 36 and positioning precision in the covering process by the adhesive is obtained so that application efficiency can be improved.

Figure 9:
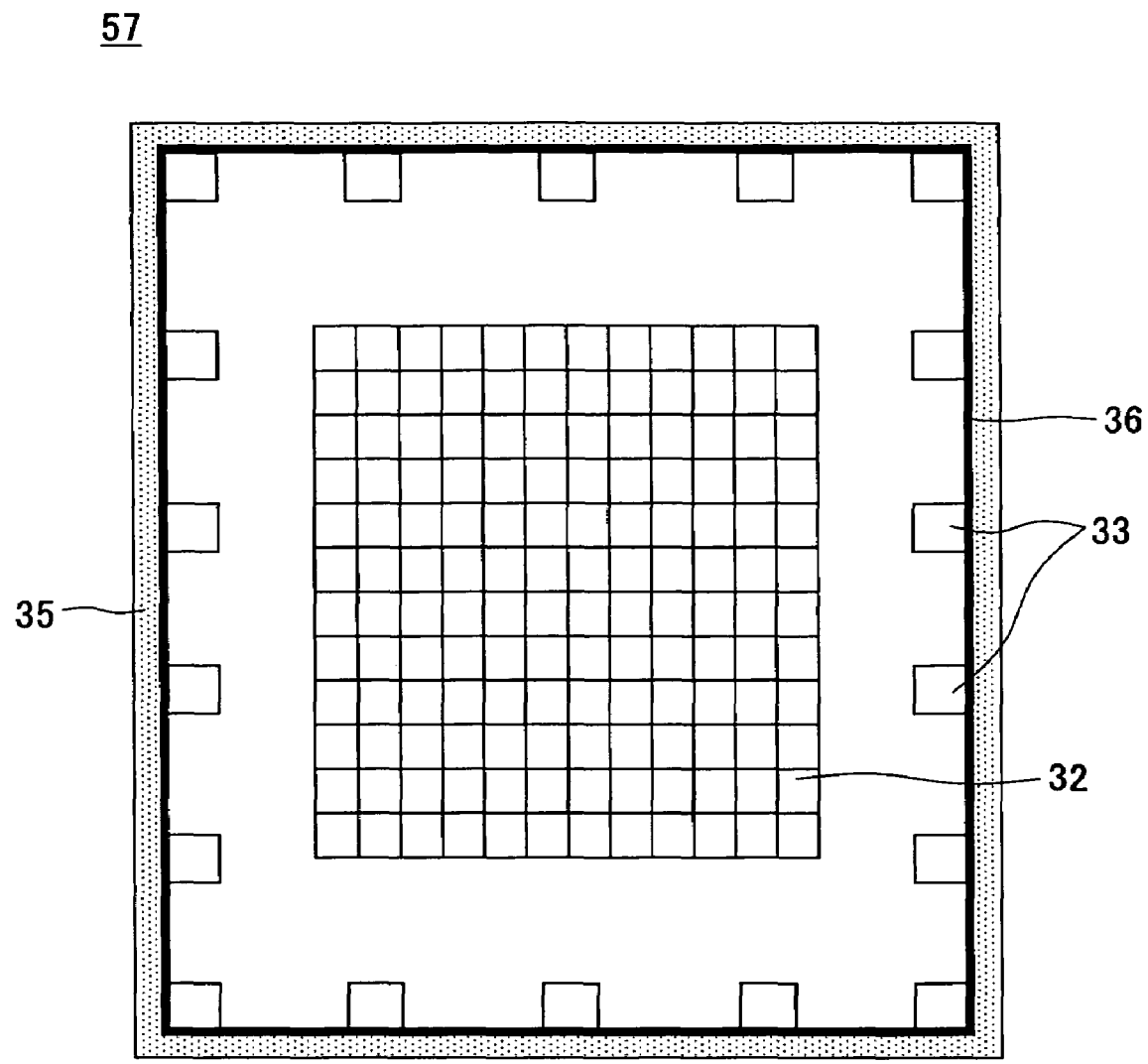
FIG. 9 is a plan view of a solid-state image sensor having a third modified example of a dam structure.

In a solid-state image sensor 57 shown in FIG. 9, by the same method as that for the solid-state image sensors 56-1 through 56-4 shown in FIG. 8, continuous projection parts 36 made of insulation material and the adhesive material layer 35 are provided between the edge part of the solid-state image sensor 57 and the outside connection terminals 33, namely outside of the outside connection terminals 33.

This structure is also formed by the following process. That is, after the continuous projections 36 made of insulation material are provided at the outside of the outside connection terminals 33 of the solid-state image sensors where the solid-state image sensors are not cut and separated from the semiconductor substrate but are adjacent to each other, the adhesive material layers 35 are formed so as to cover the outside connection terminals 33 between neighboring solid-state image sensors and then the solid-state image sensors are separated.

According to this structure, unnecessary flow of the adhesive to the light receiving element area is prevented by the projection parts 36 and positioning precision in the covering process by the adhesive is obtained so that application efficiency can be improved.

Figure 10:
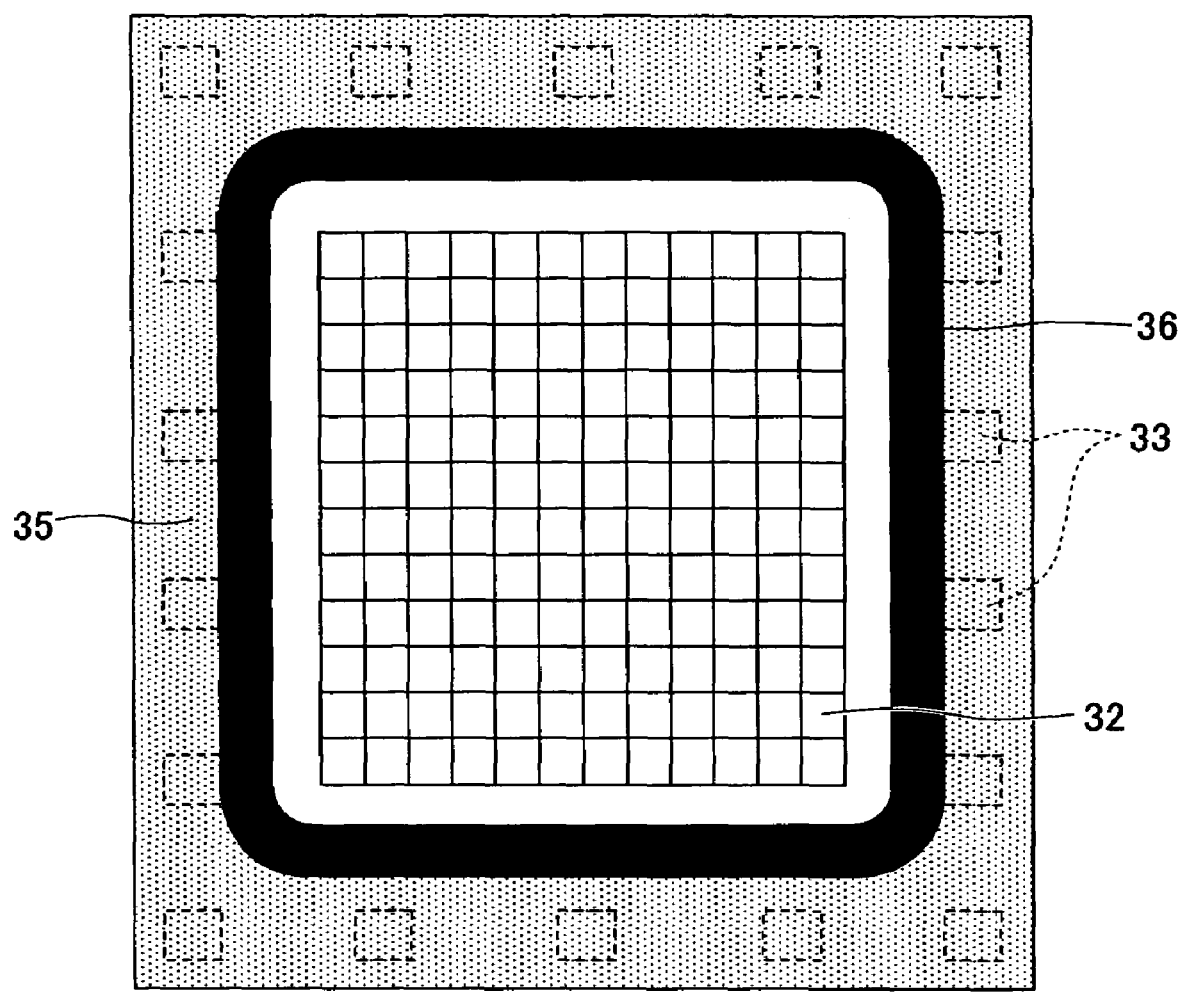
FIG. 10 is a plan view of a solid-state image sensor having a fourth modified example of a dam structure.

In a solid-state image sensor 58 shown in FIG. 10, as well as the solid-state image sensors 56-1 through 56-4 shown in FIG. 8, the adhesive material layer 35 is provided along circumferential edge parts of the semiconductor substrate 31 and covers the outside connection terminals 33. The continuous projection parts 36 made of insulation material are provided between the adhesive material layer 35 and the micro lenses 32.

In the solid-state image sensor 58, the projection part 36 having a substantially rectangular-shaped plane configuration is formed so as to surround the light receiving area. Four corners of the projection part 36 have arc-shaped configurations.

Since the corners of the projection part 36 have arc-shaped configurations, it is possible to ease the stress caused by the adhesive and others and to prevent generation of clack so that reliability of the semiconductor device can be improved.

Figure 11:
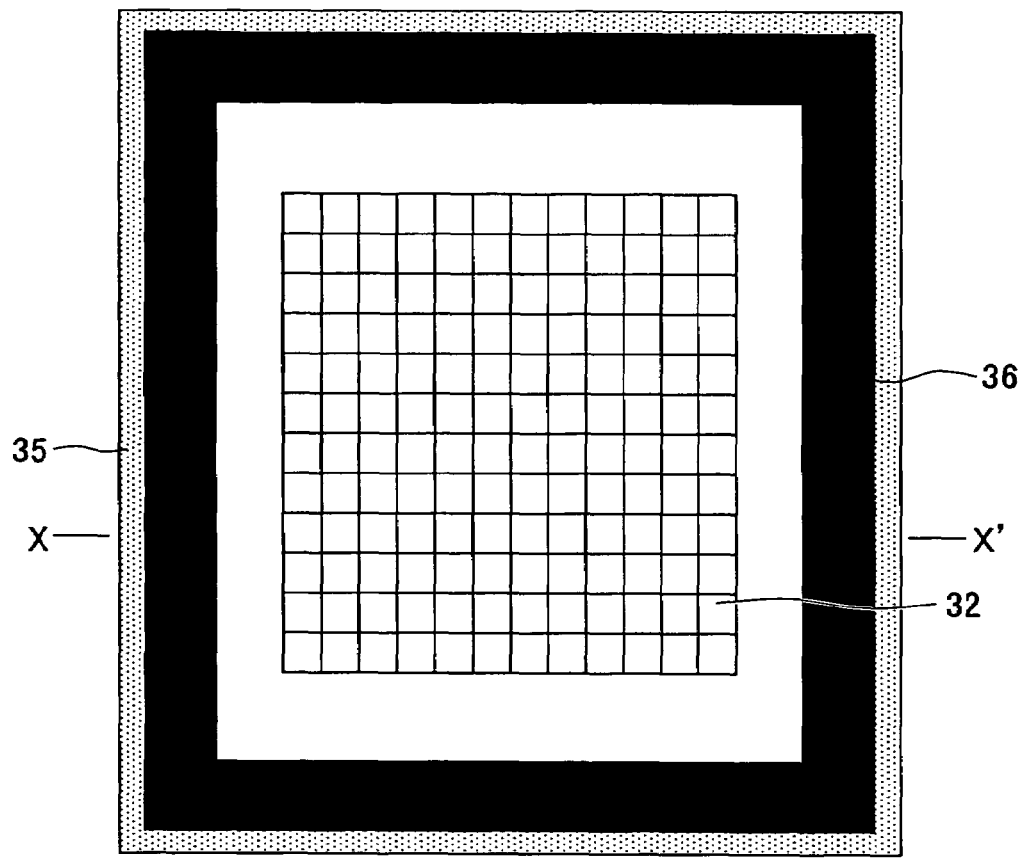
FIG. 11 is a plan view of a solid-state image sensor having a fifth modified example of a dam structure.

In a solid-state image sensor 59 shown in FIG. 11, the projection part 36 made of insulation material is provided along circumferential edge parts of the semiconductor substrate 31 and cover the outside connection terminals 33. The adhesive layer 35 is provided between the projection parts 36 of neighboring solid-state image sensors 59.

This sensor 59 is also formed by using the same method as that of the solid-state image sensor shown in FIG. 8 or FIG. 9. In the method, when the projection part 36 is provided, the width of the projection part 36 is formed so as to cover the outside connection terminals 33. The adhesive material layers 35 are formed between the neighboring solid-state image sensors 59 and then the solid-state image sensors 59 are separated.

Figure 12:
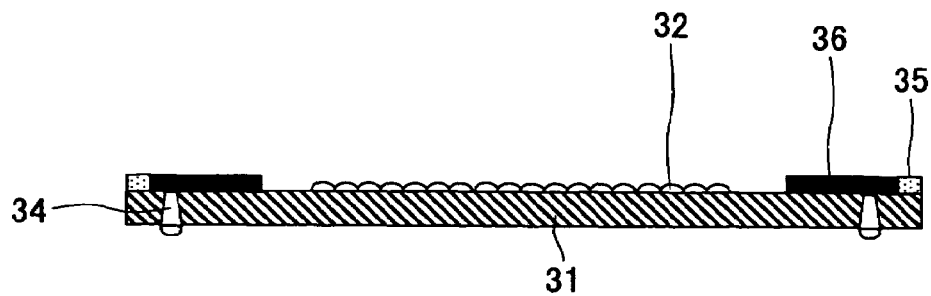
FIG. 12 is a cross-sectional view of the solid-state image sensor shown in FIG. 11.

FIG. 12 is a cross-sectional view of the solid state image sensor 59. Here, FIG. 12 is a cross section taken along X-X' of FIG. 11.

In the solid-state image sensor 59 shown in FIG. 11 and FIG. 12, as well as the example shown in FIG. 8, positioning precision in the covering process by the adhesive is obtained so that application efficiency can be improved.

Figure 13:
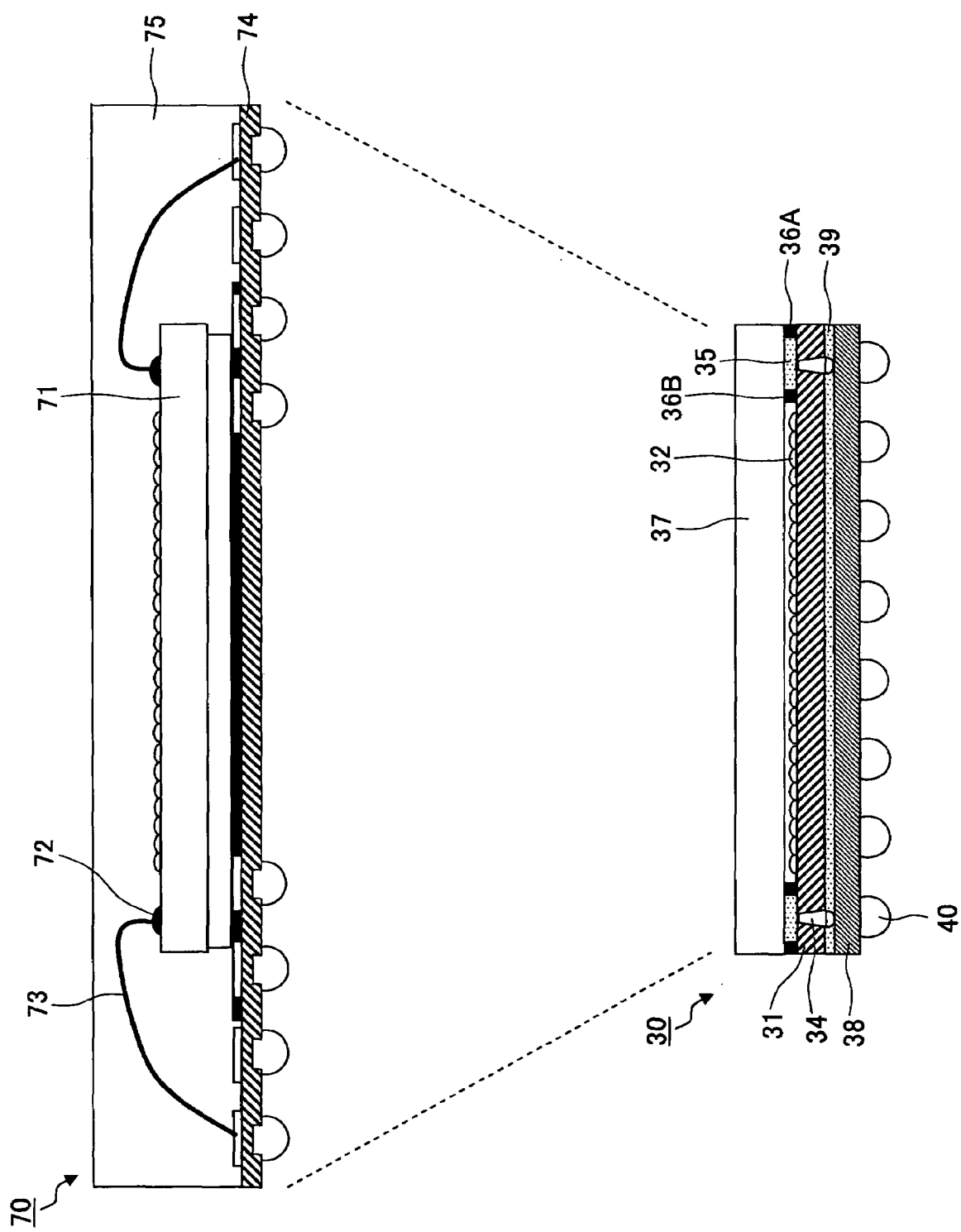
FIG. 13 is a view comparing the related art solid-state image sensing apparatus and the solid-state image sensing apparatus shown in FIG. 4.

FIG. 13 is a view comparing the related art solid-state image sensing apparatus and the solid-state image sensing apparatus shown in FIG. 4. More specifically, FIG. 13-(a) shows the related art solid-state image sensing apparatus 70 having the conventional structure. FIG. 13-(b) shows the solid state image sensing apparatus 30 shown in FIG. 4 of an embodiment of the present invention.

In the conventional structure shown in FIG. 13-(a), the electrode 72 of the solid-state image sensor 71 is led by using the bonding wire 73. The other end of the bonding wire 73 is connected to an electrode terminal on the supporting substrate 74, where the solid-state image sensor 71 is mounted, necessary in an area in the periphery of the solid-state image sensor 71. Hence, it is difficult to make the size of the supporting substrate 71, namely the size of the solid-state image sensing apparatus, small.

In the conventional structure, the solid-state image sensor 71 is sealed by the transparent resin 75. Because of this, light transmission may be degraded due to scattering and/or reflection of the incident light transmitting through the transparent resin 75. In addition, the solid-state image sensing apparatus 70 may be curved due to deformation of the transparent resin 75.

On the other hand, in the solid-state image sensing apparatus 30 of the present invention, the outside connection terminal 33 of the solid-state image sensor is led to the rear surface of the semiconductor substrate 31 by the electrode 34 piercing the semiconductor substrate 31. Hence, a large area is not required on the supporting substrate 38.

In addition, in the solid-state image sensing apparatus 30 of the present invention, the transparent plate 37 made of glass is applied to the light receiving part. Hence, the light transmission is not degraded due to scattering and/or reflection of the transmitting incident light. In addition, the solid-state image sensing apparatus 30 is not curved due to deformation of the glass plate 37.

[Manufacturing Method of Semiconductor Device]

Next, an embodiment of a manufacturing method of the semiconductor device of the present invention is discussed.

In the manufacturing method of the semiconductor device of the present invention, a wafer level lump process or a piece-making process can be applied. In the wafer level lump process, a glass plate is mounted above the semiconductor substrate without making pieces of the glass plate so that the solid-state image sensing apparatus is manufactured. In the piece-making process, the glass plate is cut so as to make the pieces of the glass plate fit into the size of the solid-state image sensor formed from the semiconductor substrate, and then the piece of the glass plate is mounted above the semiconductor substrate so that the solid-state image sensing apparatus is manufactured.

First, the manufacturing method of the solid-state image sensing apparatus using the wafer level lump process is discussed, and then the manufacturing method of the solid-state image sensing apparatus using the piece-making process is discussed.

1. The manufacturing method of the solid-state image sensing apparatus using the wafer level lump process FIG. 14 is a flowchart of a manufacturing process of the solid-state image sensing apparatus by the wafer level lump process.

In the wafer level lump process, dam structures are selectively formed on the main surface (upper surface) of the semiconductor substrate where plural solid-state image sensors are formed, by a wafer process. And then, the glass plate is mounted via the adhesive. After that, the piercing electrode is formed in the semiconductor substrate and then the glass plate and the semiconductor substrate are cut in a lump.

Figure 14:
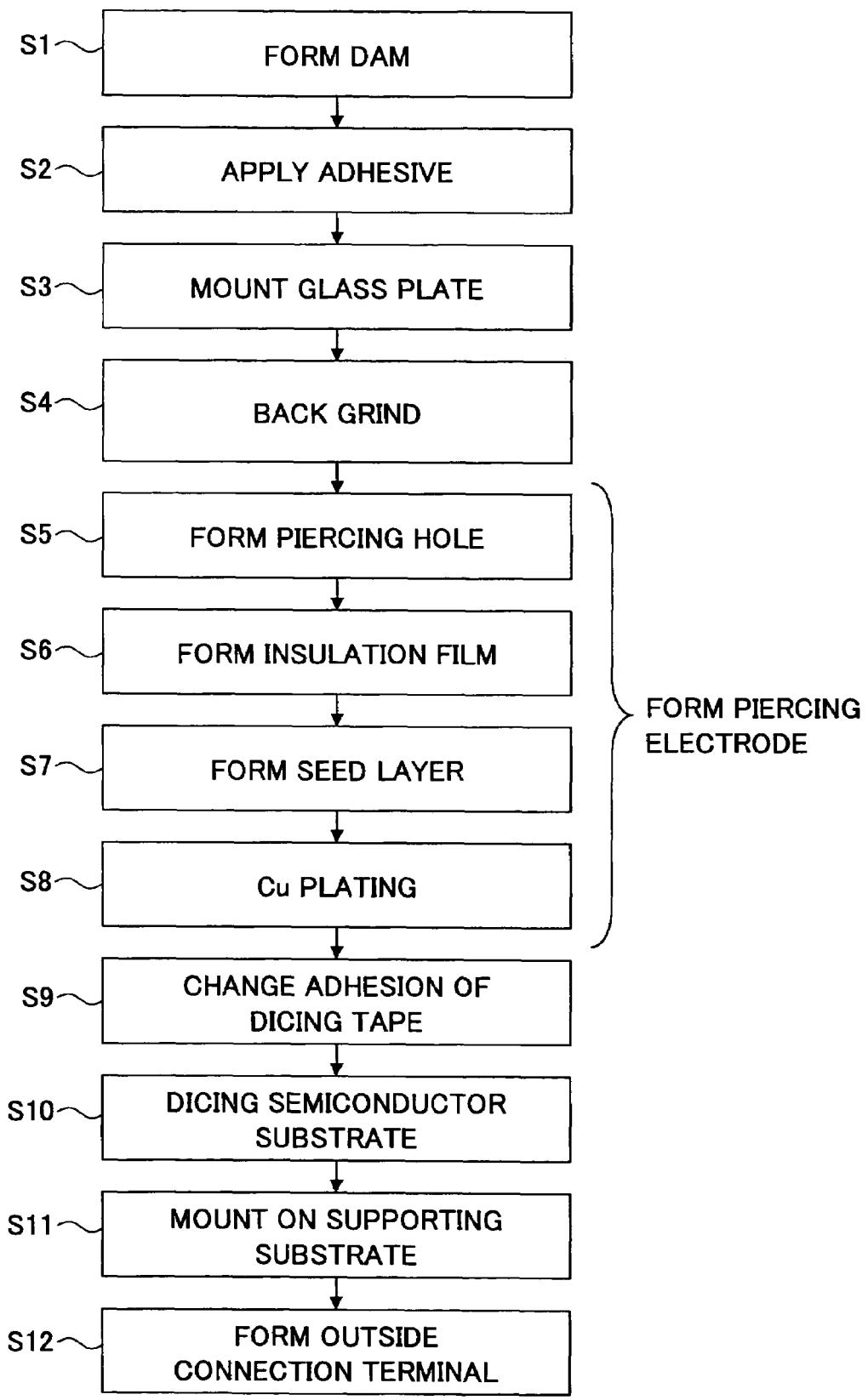
FIG. 14 is a flowchart of a manufacturing process of the solid-state image sensing apparatus by a wafer level lump process.

First, the dam structure is formed on the main surface (upper surface) of the semiconductor substrate in step 1 of FIG. 14.

Figure 15:
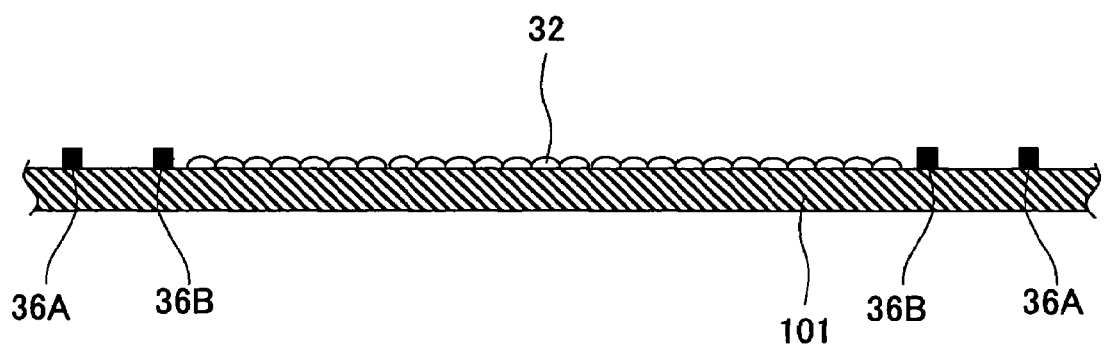
FIG. 15 is a view showing a state of a semiconductor substrate in step S1 in the process shown in FIG. 14.

A cross section of the semiconductor substrate 101 in this state is shown in FIG. 15. For convenience of explanation, in FIG. 15 through FIG. 18, only a single solid-state image sensor is illustrated.

Referring to FIG. 15, continuous first and second projection parts 36A and 36B are formed in an area of the periphery of the micro lens 32 on the upper surface of the semiconductor substrate 101 where the micro lens 32 is provided so as to be separated from each other. The first and second projection parts 36A and 36B are made of insulation material and have a height (thickness) of approximately 5 through 20 μm.

The projection parts 36A and 36B are made of, for example, silicon nitride, polyimide, a dry film, or a resist material. The projection parts 36A and 36B are formed in a belt pattern having a desirable width by a so-called photo process.

Next, the adhesive is applied between the projection parts 36A and 36B in step 2 of FIG. 14. A cross section of the semiconductor substrate 101 in this state is shown in FIG. 16.

Figure 16:
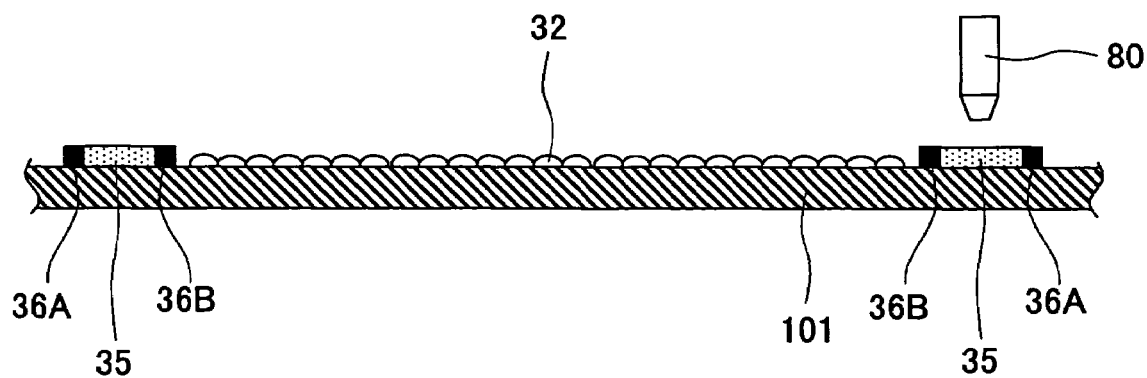
FIG. 16 is a view showing a state of a semiconductor substrate in step S2 in the process shown in FIG. 14.

As shown in FIG. 16, the adhesive is provided between the projection parts 36A and 36B by a dispenser 80. Alternatively, a tape adhesive may be adhered between the projection parts 36A and 36B.

As discussed above, thermosetting epoxy resin, ultraviolet curing resin, or both thermosetting epoxy resin and ultraviolet curing resin can be used as the adhesive according to the property of the solid-state image sensing apparatus.

The dam structure where the adhesive is applied is not limited to the structures shown in FIG. 16 and FIG. 4 through FIG. 6, and may be any of the structures shown in FIG. 7 through FIG. 11.

Next, a large sized glass plate 370 is mounted above the main surface of the semiconductor substrate 101 and fixed by the adhesive in step 3 of FIG. 14. Cross sections of the semiconductor substrates 101 in this state are shown in FIG. 17 and FIG. 18.

Figure 17:
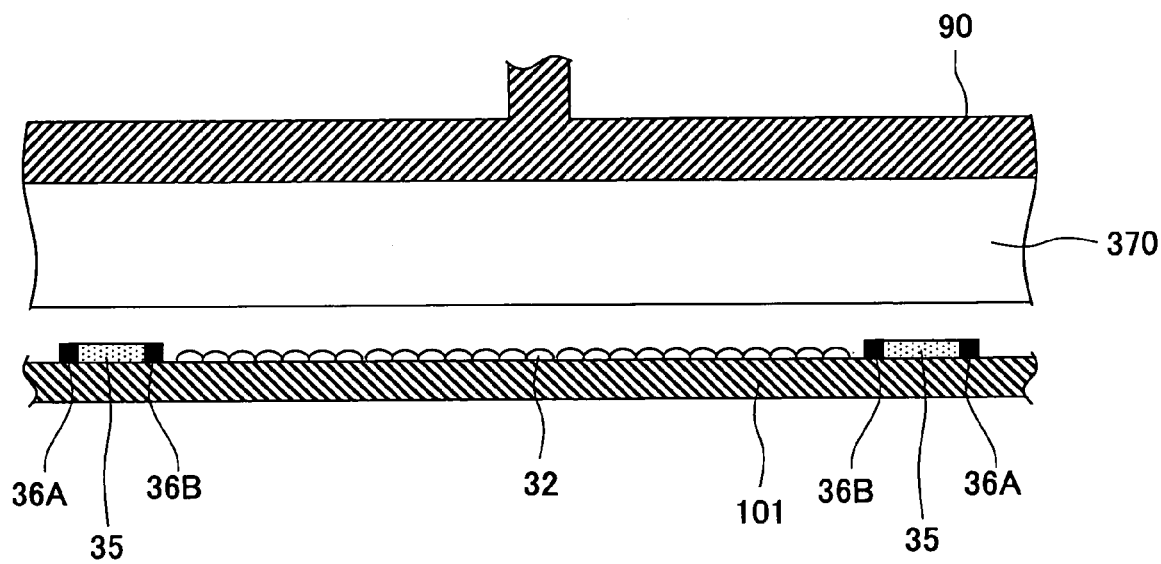
FIG. 17 is a first view showing a state of a semiconductor substrate in step S3 in the process shown in FIG. 14.
Figure 18:
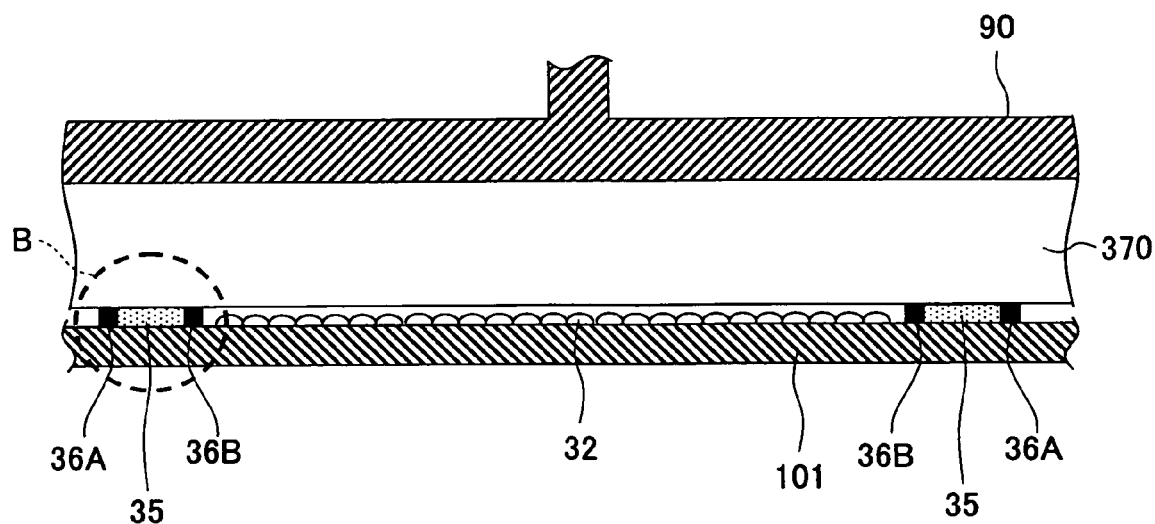
FIG. 18 is a second view showing a state of the semiconductor substrate in step S3 in the process shown in FIG. 14.

As shown in FIG. 17, for example, a pick up tool using a vacuum suction method is used in this process. More specifically, the large sized glass plate having measurement and external configuration equivalent to those of the semiconductor substrate 101 is positioned above the semiconductor substrate 101 so as to be mounted on the projection parts 36A and 36B and the adhesive layer 35 as shown in FIG. 18.

The glass plate 370 is fixed by the adhesive 35 so that a space is formed between the micro lens 32 and the glass plate 370 without making the glass plate 370 come in contact with the micro lens 32 (See FIG. 4) on the semiconductor substrate 101 and without causing the adhesive to flow onto the micro lens 32.

Next, the piercing electrode 34 is formed in the semiconductor substrate 101.

Figure 19:
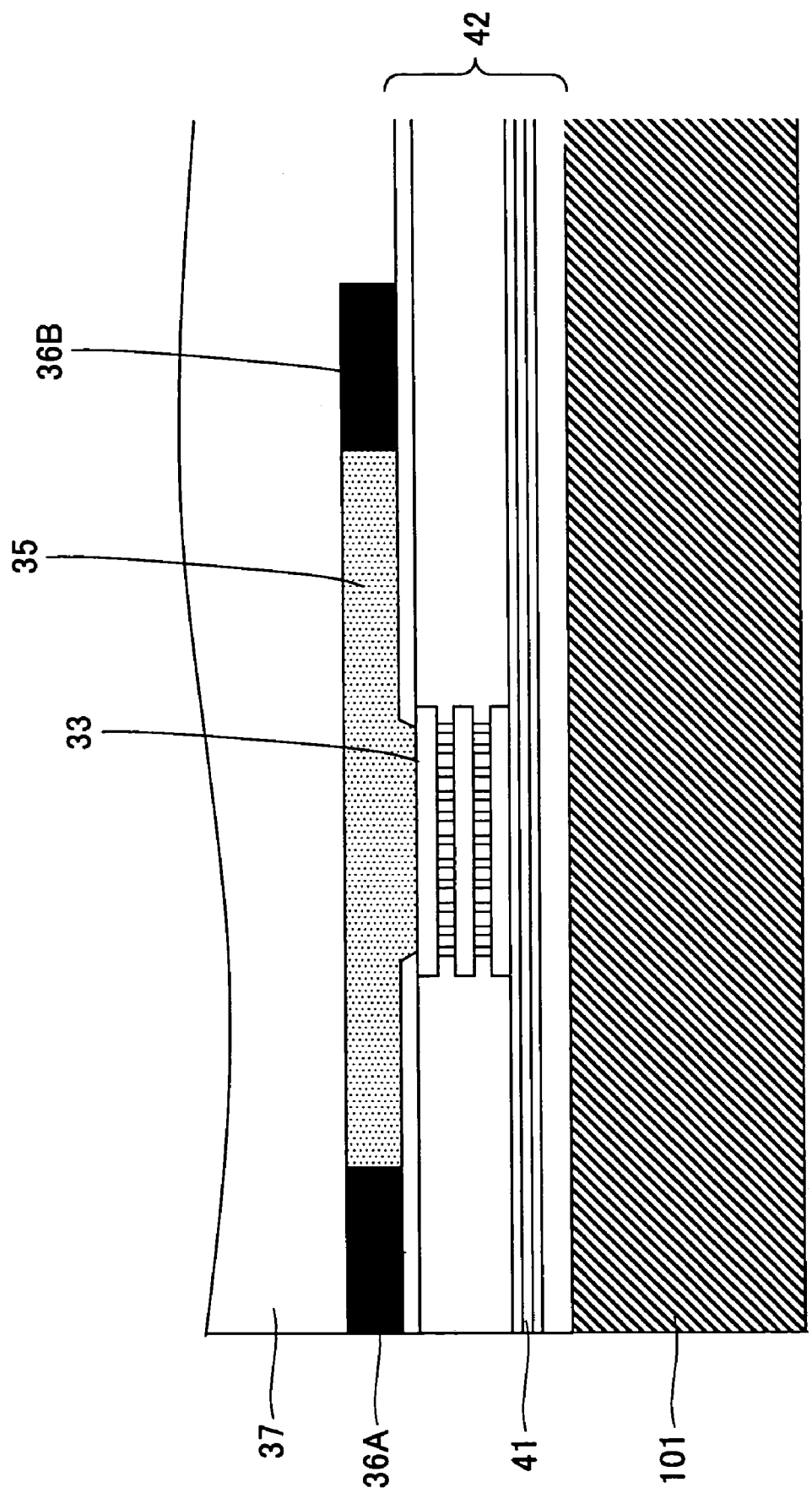
FIG. 19 is an expanded view of a part surrounded by a dotted line B in FIG. 18.

FIG. 19 is an expanded view of a part surrounded by a dotted line B in FIG. 18. Since the part surrounded by the dotted line B in FIG. 18 has the same structure as the structure shown in FIG. 6, the same numerical references are used for the same portions.

First, in step 4 of FIG. 14 a back grinding process using a well known grinding method is applied to the lower surface (rear surface) of the semiconductor substrate 101 so that the thickness of the semiconductor substrate 101 is approximately 25 through 100 μm.

Next, a photo resist layer (not shown) is formed on the rear surface of the semiconductor substrate 101. In addition, a selective etching process is applied to a part of the semiconductor substrate 101 corresponding to the outside connection terminal 33, by using a well-known photo process.

Figure 20:
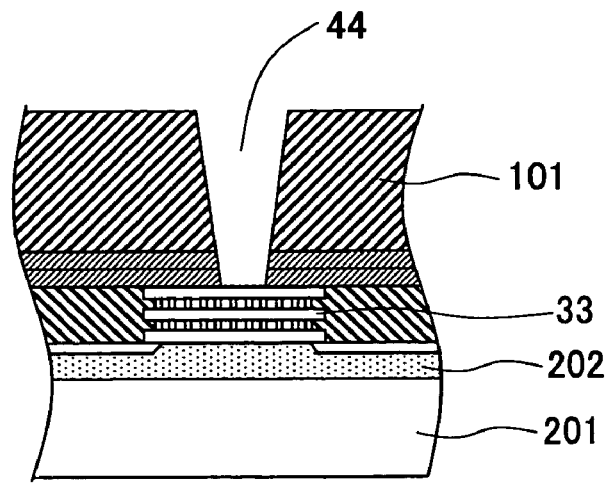
FIG. 20 is a view showing a state of a semiconductor substrate in step S5 in the process shown in FIG. 14.

In other words, a photo resist pattern is selectively formed on the rear surface of the semiconductor substrate 101 so that an opening is formed in a position corresponding to the outside connection terminal 33. By using the photo resist pattern as a mask, a dry etching process using a fluoride group gas as an etchant is applied. As a result of this, the piercing hole 44 piercing from the rear surface of the semiconductor substrate 101 to a lower surface, namely the semiconductor substrate 101 side, of the electrode pad 48, is formed in step 5 of FIG. 14. A cross section of the semiconductor substrates 101 in this state is shown in FIG. 20. In FIG. 20, the rear surface of the semiconductor substrate 101 faces upward.

After the etching process, the photo resist is removed. The piercing hole 44 has a taper-shaped configuration wherein the opening measurement at a rear surface side of the semiconductor substrate 101 is greater than the opening measurement at a side of the outside connection terminal 33.

In the processes shown in FIG. 20 through FIG. 23, a main surface of the processed semiconductor substrate 101 is fixed and held on the supporting substrate 201 made of a semiconductor substrate or a metal plate, by the adhesive layer 202 so that a designated process is applied.

Figure 21:
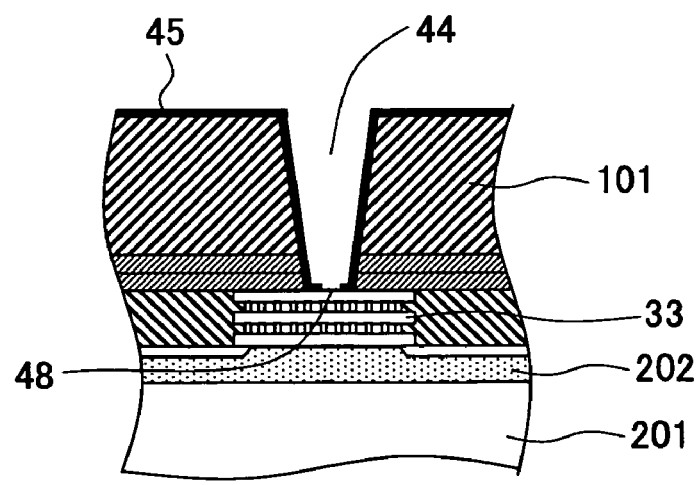
FIG. 21 is a view showing a state of a semiconductor substrate in step S6 in the process shown in FIG. 14.

Next, the insulation layer 45 is provided in the piercing hole 44 and on the rear surface of the semiconductor substrate 101 in step 6 of FIG. 14. A cross section of the semiconductor substrates 101 in this state is shown in FIG. 21.

The insulation layer 45 is provided so that it is possible to prevent the semiconductor substrate 101 and the piercing electrode 34 from being electrically connected when the piercing electrode 34 is provided in the piercing hole 44. A silicon nitride film or a silicon oxide film having thickness of approximately 1 μm, for example, is used as the insulation layer 45.

The insulation layer 45 is formed by the well-known sputtering method or CVD (Chemical Vapor Deposition) method. Then, a well-known anisotropic dry etching process is applied so that the insulation layer 45 provided in the piercing hole 44 and covering the surface of the outside connection terminal 33 is selectively removed and the opening part 48 is formed. The outside connection terminal 33 is exposed at the opening part 48.

Figure 22:
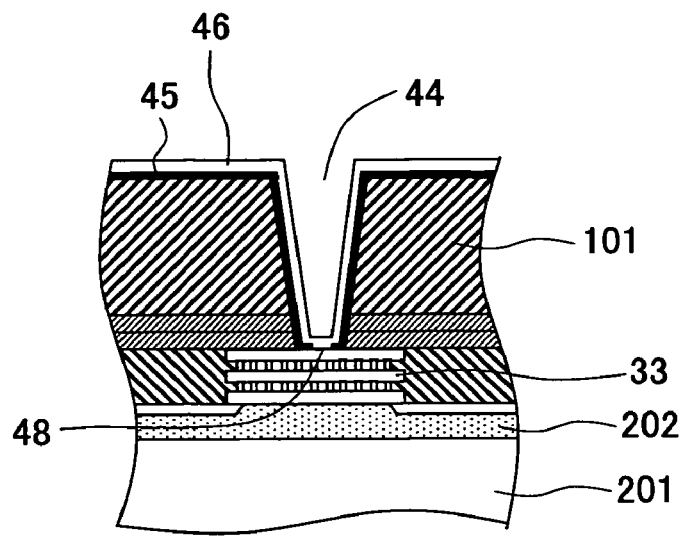
FIG. 22 is a view showing a state of a semiconductor substrate in step S7 in the process shown in FIG. 14.

Next, a seed layer (base metal layer) 46 for electrical plating is formed in the piercing hole 44 and on the rear surface of the semiconductor substrate 101 in step 7 of FIG. 14. A cross section of the semiconductor substrate 101 in this state is shown in FIG. 22.

The seal layer 46 is, for example, made of a lower layer of titanium (Ti) having a thickness of approximately 2 μm and an upper layer of a copper (Cu) having a thickness of approximately 0.5 μm, and formed by the sputtering method or the like.

Next, an electric plating process is applied so that the piercing hole 44 is filled by metal and the piercing electrode 34 is formed.

As the metal filling in the piercing hole 44 as a result of the electric plating process, copper (Cu) can be used because copper can be easily plated and has a low electric resistance value. In addition, if necessary, a plating layer made of a nickel (Ni) base layer and a gold (Au) surface layer is formed on the surface of the piercing electrode 34. The nickel (Ni) layer has a thickness of approximately 2 μm and the gold (Au) layer has a thickness of approximately 0.5 μm.

Figure 23:
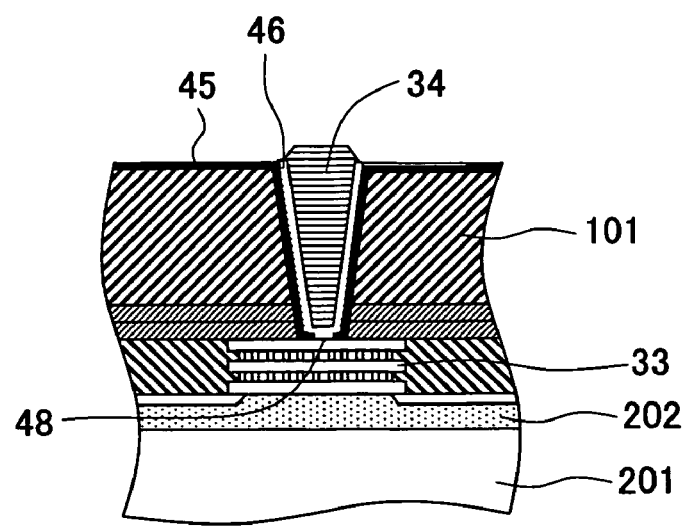
FIG. 23 is a view showing a state of a semiconductor substrate in step S8 in the process shown in FIG. 14.

After that the seed layer 46 remaining in the periphery of the piercing electrode 34 is removed so that the insulation layer 45 is exposed. As a result of this, the piercing electrode projecting from the rear surface of the semiconductor substrate 101 by approximately 5 through 15 μm is formed in step 8 of FIG. 14. A cross section of the semiconductor substrate 101 in this state is shown in FIG. 23.

Thus, via the process shown in step 5 through step 8 of FIG. 14, the piercing hole 34 is formed in the semiconductor substrate 101.

Next, in step 9 of FIG. 14, a dicing tape formed by an adhesive tape is adhered on the rear surface of the semiconductor substrate 101 by a well-known method.

In step 10 of FIG. 14A, a dicing process is applied, from a surface side of the semiconductor substrate 101, to the semiconductor substrate 101 together with the glass plate 370 so as to divide them into and make multiple pieces of the solid-state image sensors 31.

At this time, the width of the dicing line of the semiconductor substrate 101 can be equal to or less than 90 μm. Therefore, the number of solid-state image sensors 31 formed in the semiconductor substrate 101 is not decreased.

Next, the dicing tape adhered on the rear surface of the solid-state image sensor 31 is removed and the solid-state image sensor 31 is mounted on the supporting substrate 38 (See FIG. 4) in step 11 of FIG. 14.

In the structure shown in FIG. 4, the solid-state image sensor 31 is fixed on the main surface of the supporting substrate (interposer) 38 via the resin material (underfill) 32. The piercing electrode 34 is electrically and mechanically connected to an electrode formed on the surface of the supporting substrate 38 by the solder bump 36.

However, the present invention is not limited to this. For example, an electric connection between the piercing electrode 34 and the electrode formed on the supporting substrate 38 may be realized by forming a gold (Au) or copper (Cu) bump on the piercing electrode 34 and using a supersonic wave connection method or thermo compression bonding method. The electric connection between the piercing electrode 34 and the electrode formed on the supporting substrate 38 may also be realized by printing a silver (Ag) paste on the supporting substrate 38 and using a pick and place method such as die bonding or the like.

After that, by a well-known method, the outside connection terminal 40 is provided on the rear surface of the supporting substrate 38 in step 12 of FIG. 14 so that the solid-state image sensing apparatus 30 shown in FIG. 4 is formed.

2. The manufacturing method of the solid-state image sensing apparatus using the piece-making process is discussed.

Figure 24:
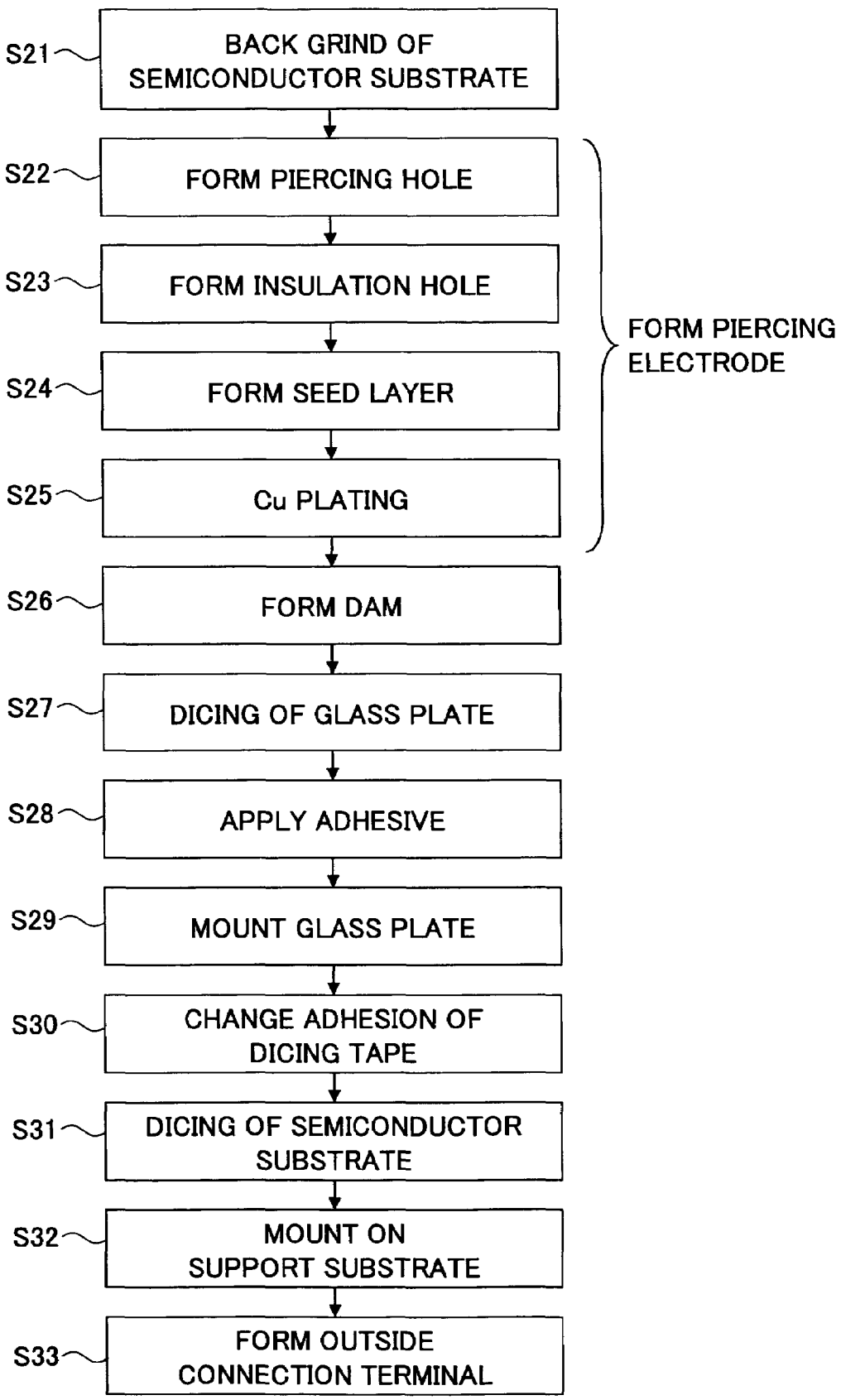
FIG. 24 is a flowchart showing of a manufacturing process of the solid-state image sensing apparatus by a piece-making process.

FIG. 24 is a flowchart of a manufacturing process of the solid-state image sensing apparatus by the piece-making process.

Referring to FIG. 24, in this manufacturing method, by using a so-called wafer process, the piercing electrode 34 is formed in the semiconductor substrate 101 having the main surface (upper surface) where plural solid-state image sensors are formed and then, the dam structures surrounding the light receiving element areas are formed for the solid-state image sensors.

On the other hand, a piece of the glass plate 37, the piece being made in advance as corresponding to the size of the solid-state image sensor, is prepared.

The glass plate 37 is mounted and fixed on the dam structure of the solid-state image sensor and then the dicing process is applied to the semiconductor substrate 101.

Illustration and detailed explanation of a processes same as the processes shown in FIG. 14 are omitted.

First, the same processes as step 4 through step 8 of FIG. 14 are applied to the semiconductor substrate 101 in step 21 through step 25, respectively, of FIG. 24, so that the piercing electrode 34 is formed in the semiconductor substrate 101.

Next, the same process as step 1 of FIG. 14 is applied to the semiconductor substrate 101 in step 26 of FIG. 24, so that the first and second projection parts 36A and 36B are formed on the semiconductor substrate 101.

In other words, the continuous belt projection parts 36A and 36B made of insulation material are formed at the outside of the micro lens 32 on the upper surface of the semiconductor substrate 101 so as to be separated and face each other.

On the other hand, the dicing process is applied to the large sized glass plate 370 in step 27 of FIG. 24. The dicing tape having an adhesive property is adhered on the rear surface of the glass plate 370 by a well-known technique. The dicing process is applied from the surface side of the glass plate 370 so that the glass plate 370 is divided and therefore pieces of the glass plate 370 having the size and configuration corresponding to those of the solid-state image sensors 31 are formed.

Next, the same process as step 2 of FIG. 14 is applied to the semiconductor substrate 101 in step 28 of FIG. 24, so that the adhesive is applied between the first projection part 36A and the second projection part 36B.

While the first projection part 36A and the second projection part 36B form the dam which dam prevents flowing of the adhesive across the dam, the structure of the dam is not limited to the structures shown in FIG. 16 and FIG. 4 through FIG. 6. The structure may be as shown in FIG. 7 through FIG. 11.

After that, the same process as step 3 of FIG. 14 is applied to the semiconductor substrate 101 in step 29 of FIG. 24. The glass plate 37, having the size corresponding to the size of the solid-state image sensor 31 as a result of the dicing process in step 27, is mounted above the solid-state image sensor 31 and fixed by the adhesive material layer 35.

Next, the same process as step 9 of FIG. 14 is applied to the semiconductor substrate 101 in step 30 of FIG. 24. The dicing tape having an adhesive property is adhered on the rear surface of the semiconductor substrate 101. After that, the same process as step 10 of FIG. 14 is applied to the semiconductor substrate 101 in step 31 of FIG. 24. The dicing process is applied to the semiconductor substrate 101 where the glass plate 37 is mounted so that the semiconductor substrate 101 is divided into the solid-state image sensors 31.

Next, the dicing tape provided on the rear surface of the solid-state image sensor 31 is removed and then the solid-state image sensor 31 is mounted on the supporting substrate 38 in step 32 of FIG. 24. After that, the outside connection terminal 40 is formed on the rear surface of the supporting substrate 38 by a well-known technique so that the solid-state image sensing apparatus 30 shown in FIG. 4 is formed in step 33 of FIG. 24.

Thus, in the manufacturing method of the solid-state image sensing apparatus 30 of an embodiment of the present invention, the wafer level lump process whereby the glass plate 370 is mounted above the semiconductor substrate 101 without making pieces of the glass plate 370, or the piece-making process whereby the glass plate 370 is cut so as to make the pieces of the glass plate 370 fitting into the size of the solid-state image sensor 31 formed from the semiconductor substrate 101, and then the pieces of the glass plate 370 are mounted above the semiconductor substrate 101, can be selected.

According to the wafer level lump process method, it is possible to omit a process separately dicing the large size glass plate 370 in step 27 of FIG. 24 so that the manufacturing process can be simplified.

On the other hand, according to the piece-making process method, it is possible to select good solid-state image sensors 31 in advance and mount the pieces of the glass plate 370 above only good solid-state image sensors 31. Therefore, it is possible to decrease the number of members forming the solid-state image sensing apparatus so that the manufacturing cost can be reduced.

In addition, according to the piece-making process method, it is not necessary for the blade used for dicing the glass plate 370 to be used for dicing the semiconductor substrate 101. Therefore, a blade proper for cutting the glass plate can be used.

Furthermore, the blade used for dicing and dividing the semiconductor substrate 101 into pieces of the solid-state image sensors 31 is not used for cutting the glass plate 370. Hence, it is possible to prevent abrasion of the blade used for dicing and dividing the semiconductor substrate 101.

Thus, according to the present invention, in either the wafer level lump process method or the piece-making process method, it is possible to stably manufacture the semiconductor device having good light transmission ability and a small size, at high productivity.

The present invention is not limited to these embodiments, but variations and modifications may be made without departing from the scope of the present invention.

For example, in the above-discussed embodiments, the solid-state image sensing device is explained as an example of the semiconductor device of the present invention, and the solid-state image sensor is explained as an example of the semiconductor element forming the semiconductor device of the present invention. However, the present invention is not limited to this. The semiconductor element is not limited to the solid-state image sensor such as an image sensor but may be, for example, a fingerprint sensor using glass. In addition, the present invention can be applied to a semiconductor device such as an optical module or Erasable Programmable Read Only Memory (EPROM).

This patent application is based on Japanese Priority Patent Application No. 2006-32664 filed on Feb. 9, 2006, the entire contents of which are hereby incorporated by reference.

What is claimed is:

1. A semiconductor device, comprising: a semiconductor substrate having a main surface where a light receiving element area is formed; a projection part provided in the periphery of the light receiving element area on the main surface of the semiconductor substrate; an adhesive material layer provided in the external periphery of the projection part on the main surface of the semiconductor substrate; a transparent plate supported by the projection part and fixed above the light receiving element area by the adhesive material layer, wherein the projection part comes in contact with a lower surface of the transparent plate; the projection part and the transparent plate are made of materials different from each other; wherein the projection part is formed by a first projection part and a second projection part; and the adhesive layer is provided between the first projection part and the second projection part; wherein the semiconductor substrate is fixed to a supporting substrate; a piercing electrode electrically connecting the semiconductor substrate and the supporting substrate is formed so as to pierce inside of the semiconductor substrate; and the piercing electrode is provided in the semiconductor substrate between the first projection part and the second projection part.

2. The semiconductor device as claimed in claim 1,
wherein the semiconductor substrate is fixed to a supporting substrate; and
a piercing electrode electrically connecting the semiconductor substrate and the supporting substrate is formed so as to pierce inside of the semiconductor substrate.

3. The semiconductor device as claimed in claim 2,
wherein the projection part is formed between the light receiving element area and a part of the main surface of the semiconductor substrate, the part corresponding to where the piercing electrode is formed.

4. The semiconductor device as claimed in claim 2,
wherein the projection part is formed outside of a part of the main surface of the semiconductor substrate, the part corresponding to where the piercing electrode is formed.

5. The semiconductor device as claimed in claim 2,
wherein the projection part is formed on a part of the main surface of the semiconductor substrate, the part corresponding to where the piercing electrode is formed.

6. The semiconductor device as claimed in claim 2,
wherein the piercing electrode is formed in the semiconductor substrate outside of the light receiving element area.

7. The semiconductor device as claimed in claim 1,
wherein the projection part is formed on the main surface of the semiconductor substrate so as to surround the light receiving element area; and
the projection part includes a curved line part.

8. The semiconductor device as claimed in claim 1,
wherein a coefficient of viscosity of the adhesive layer is equal to or less than 1 Pa·s.

9. The semiconductor device as claimed in claim 1,
wherein a filler is added into the adhesive layer.

10. The semiconductor device as claimed in claim 1, wherein the projection part is formed by a material selected from a group consisting of a liquid state resist material, a dry film, polyimide, and a nitride film using photolithography.

11. The semiconductor device as claimed in claim 1, wherein the adhesive material layer has the same height as the height of the projection part.

* * * * *